(12) United States Patent
Chen et al.

(10) Patent No.: US 11,906,571 B2
(45) Date of Patent: Feb. 20, 2024

(54) OPTICAL DETECTION SYSTEM AND LASER LIGHT PROVIDING MODULE WITHOUT USING AN OPTICAL FIBER

(71) Applicant: MPI CORPORATION, Hsinchu County (TW)

(72) Inventors: Chien-Yu Chen, Hsinchu County (TW); Po-Han Peng, Hsinchu County (TW)

(73) Assignee: MPI CORPORATION, Hsinchu County (TW)

(*) Notice: Subject to any disclaimer, the term of this patent is extended or adjusted under 35 U.S.C. 154(b) by 221 days.

(21) Appl. No.: 17/700,441

(22) Filed: Mar. 21, 2022

(65) Prior Publication Data
US 2022/0299560 A1 Sep. 22, 2022

Related U.S. Application Data

(60) Provisional application No. 63/164,027, filed on Mar. 22, 2021.

(51) Int. Cl.
*G01R 31/26* (2020.01)
*G02B 5/00* (2006.01)
*H01S 5/02212* (2021.01)
*H01S 5/00* (2006.01)

(52) U.S. Cl.
CPC ......... *G01R 31/2635* (2013.01); *G02B 5/005* (2013.01); *H01S 5/0085* (2013.01); *H01S 5/02212* (2013.01)

(58) Field of Classification Search
CPC ............ G01R 31/2632; G01R 31/2633; G01R 31/2635
See application file for complete search history.

(56) References Cited

U.S. PATENT DOCUMENTS

| | | | | |
|---|---|---|---|---|
| 5,170,217 A | * | 12/1992 | Nishimoto | ......... G01B 9/02056 356/495 |
| 2001/0028454 A1 | * | 10/2001 | Savareigo | ........ G01N 21/95692 356/237.5 |
| 2018/0232873 A1 | | 8/2018 | Inoue et al. | |

* cited by examiner

*Primary Examiner* — Tung X Nguyen
(74) *Attorney, Agent, or Firm* — Li & Cai Intellectual Property Office

(57) ABSTRACT

An optical detection system and a laser providing module without using an optical fiber thereof are provided. The optical detection system includes a carrier module, a laser light providing module, and an electrical detection module. The carrier module is configured to carry a plurality of photodiodes. The laser light providing module is disposed above the carrier module. The electrical detection module is adjacent to the carrier module. The laser light providing module is configured to convert a laser light source into a plurality of laser light beams, thereby simultaneously and respectively exciting two corresponding ones of the photodiodes. The electrical detection module is configured to simultaneously and electrically contact the corresponding photodiodes so as to obtain an electrical signal generated by each of the photodiodes.

10 Claims, 15 Drawing Sheets

OPTICAL DETECTION SYSTEM AND LASER LIGHT PROVIDING MODULE WITHOUT USING AN OPTICAL FIBER

CROSS-REFERENCE TO RELATED PATENT APPLICATION

This application claims the benefit of priority to the U.S. Provisional Patent Application Ser. No. 63/164,027 filed on Mar. 22, 2021, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a detection system and a light providing module, and more particularly to an optical detection system and a laser light providing module without using an optical fiber.

BACKGROUND OF THE DISCLOSURE

A photodiode (PD) is an electronic component that can be used to receive a light source and then convert the received light source into an output electrical signal. In a conventional photodiode testing system, after a laser light source is provided to the photodiode, the electrical signal generated by the photodiode is received so as to analyze the electronic characteristics of the photodiode.

Furthermore, as shown in FIG. 1, in the conventional photodiode testing system, firstly a laser light source 1a can sequentially pass through a first optical fiber 2a, an optical switch 3a, a second optical fiber 4a and a first lens 5a to form a laser beam, and then the laser beam can sequentially pass through a beam splitter 6a and a second lens 7a to form a single spot that is projected onto a photodiode 8a so as to excite the photodiode 8a to generate an electrical signal. Finally, a probe tip of a probe card can be used to contact pads of the photodiode 8a so as to obtain the electrical signal generated by the photodiode 8a that has been excited by the laser beam, so that the electronic characteristics of the photodiode 8a can be analyzed due to the electrical signal that is obtained by the probe card.

SUMMARY OF THE DISCLOSURE

In the above-mentioned photodiode testing system, the laser light source needs to be transmitted through an optical fiber. However, the stability of the laser light source during transmission in the optical fiber will be affected by the bending curvature of the optical fiber, resulting in that the stability of the energy that is provided by the laser light source is not good, thereby reducing the measurement accuracy of the electrical signal that is generated by the photodiode. In addition, when a laser generator equipped with a laser light source and an optical fiber is used, a spot size of a laser beam provided by the laser light source after passing through the optical fiber is relatively concentrated, so that the laser beam can no longer be split. As a result, a single laser beam can only detect a single photodiode, which greatly reduces the detection efficiency of the photodiode, thereby limiting the application of the laser generator in the photodiode testing system. Therefore, the cooperation of the laser generator with the optical fiber has the above-mentioned limitations, and so how to detect a plurality of photodiodes at the same time, or how to detect the photodiodes in different wavelength ranges will be the problems to be solved by the present disclosure.

In order to solve the above-mentioned problems, one of the technical aspects adopted by the present disclosure is to provide an optical detection system, which includes a carrier module, a laser light providing module, an electrical detection module and an image capturing module. The carrier module is configured for carrying a plurality of photodiodes. The laser light providing module is configured to be disposed above the carrier module. The electrical detection module is configured to be disposed adjacent to the carrier module. The image capturing module is configured to be disposed above the carrier module. The laser light providing module includes a laser chip package structure without using an optical fiber, a first optical lens adjacent to the laser chip package structure, and a beam quantity adjuster adjacent to the first optical lens. The laser chip package structure is configured for generating a laser light source projected onto the first optical lens, and the first optical lens is configured for converting the laser light source into a laser beam projected onto the beam quantity adjuster, and the beam quantity adjuster is configured for splitting the laser beam into a plurality of projection beams. When the projection beams are simultaneously and correspondingly projected onto the photodiodes, the image capturing module is configured for capturing position information of a light spot projected by the projection beam on an active region of a corresponding one of the photodiodes. When each of the photodiodes is excited by a corresponding one of the projection beams to correspondingly generate an electrical signal, the electrical detection module is configured for simultaneously and electrically contacting the photodiodes so as to sequentially obtain the electrical signals that are correspondingly generated by the photodiodes.

In the optical detection system provided by one of the technical aspects of the present disclosure, the laser light providing module disposed above the carrier module includes a laser chip package structure without using an optical fiber, the laser chip package structure without using the optical fiber can be used to provide a laser light source with a larger light spot on the first optical lens, and the first optical lens can be used to convert the laser light source into a laser beam with a larger light spot. The beam quantity adjuster can be used to divide a laser beam with the larger light spot into a plurality of projection beams, and the projection beams can be respectively projected onto a plurality of photodiodes that are carried by the carrier module so as to correspondingly excite the photodiodes. In addition, the image capturing module can be used to capture a position information of a light spot projected by the projection beam on an active region of a corresponding one of the photodiodes, so as to determine whether the actual projection beam is at an expected position of the active region of the photodiode. Furthermore, the electrical detection module can be used to electrically contact the photodiodes so as to obtain a plurality of electrical signals respectively generated by the photodiodes. Therefore, since the laser light providing module can adopt a laser chip package structure without using the optical fiber, the laser chip package structure without using the optical fiber can provide a laser light source that has a light spot size larger than that of a laser light source provided by the laser chip package structure using an optical fiber. Moreover, since the laser light source can be transmitted without using the optical fiber, the stability of the laser light source provided by the laser chip package structure without using the optical fiber can be improved, thereby ensuring the measurement accuracy when measuring the electrical signal generated by the photodiode. In addition, since the image capturing module can be used to determine whether the actual projected light beam is at an expected position on the active region of the photodiode, the alignment accuracy of the photodiode can be improved during the detection of the photodiode. Furthermore, since the beam quantity adjuster can be used to divide or convert the laser light source into a plurality of projection beams so as to detect the photodiodes at the same time, the detection efficiency of a large number of photodiodes can be improved during the detection of the photodiodes. In this way, the present disclosure can provide an optical detection system that can detect the plurality of photodiodes at the same time, which can not only ensure the measurement accuracy and the alignment accuracy of the photodiode, but also improve the detection efficiency of the large number of photodiodes.

In order to solve the above-mentioned problems, another one of the technical aspects adopted by the present disclosure is to provide an optical detection system, which includes a carrier module, a laser light providing module and an electrical detection module. The carrier module is configured for carrying a plurality of photodiodes. The laser light providing module is provided without an optical fiber and is configured to be disposed above the carrier module. The electrical detection module is configured to be disposed adjacent to the carrier module. The laser light providing module is configured for converting a laser light source into a plurality of projection beams so as to simultaneously and correspondingly excite the photodiodes. The electrical detection module is configured for electrically contacting the photodiodes so as to obtain an electrical signal generated by each of the photodiodes.

In the optical detection system provided by another one of the technical aspects of the present disclosure, the laser light providing module without using an optical fiber is disposed above the carrier module, and the laser light providing module without using the optical fiber can be used to provide a laser light source with a larger light spot. The laser light providing module without using the optical fiber can be used to divide a laser beam with the larger light spot into a plurality of projection beams, and the projection beams can be respectively projected onto a plurality of photodiodes that are carried by the carrier module so as to correspondingly excite the photodiodes. Furthermore, the electrical detection module can be used to electrically contact the photodiodes so as to obtain a plurality of electrical signals respectively generated by the photodiodes. Therefore, since the laser light providing module can be used without using the optical fiber, the laser light providing module without using the optical fiber can provide a laser light source that has a light spot size larger than that of a laser light source provided by the laser light providing module using an optical fiber. Moreover, since the laser light source can be transmitted without using the optical fiber, the stability of the laser light source provided by the laser light providing module without using the optical fiber can be improved, thereby ensuring the measurement accuracy when measuring the electrical signal generated by the photodiode. Furthermore, since the laser light providing module can be used to divide or convert the laser light source into a plurality of projection beams so as to detect the photodiodes at the same time, the detection efficiency of a large number of photodiodes can be improved during the detection of the photodiodes. In this way, the present disclosure can provide an optical detection system that can detect the plurality of photodiodes at the same time, which can not only ensure the measurement accuracy of the photodiode, but also improve the detection efficiency of the large number of photodiodes.

In order to solve the above-mentioned problems, yet another one of the technical aspects adopted by the present disclosure is to provide a laser light providing module without using an optical fiber, which includes a laser chip package structure, an optical lens and a beam quantity adjuster. The optical lens is configured to be disposed adjacent to the laser chip package structure. The beam quantity adjuster is configured to be disposed adjacent to the optical lens. The laser chip package structure is configured for generating a laser light source projected onto the optical lens, and the optical lens is configured for converting the laser light source into a laser beam projected onto the beam quantity adjuster, and the beam quantity adjuster is configured for splitting the laser beam into a plurality of projection beams so as to simultaneously and correspondingly excite a plurality of photodiodes.

In the laser light providing module without using the optical fiber provided by yet another one of the technical aspects of the present disclosure, the laser light providing module includes a laser chip package structure without using an optical fiber, the laser chip package structure without using the optical fiber can be used to provide a laser light source with a larger light spot on the optical lens, and the optical lens can be used to convert the laser light source into a laser beam with a larger light spot. The beam quantity adjuster can be used to divide a laser beam with the larger light spot into a plurality of projection beams, and the projection beams can be respectively projected onto a plurality of photodiodes so as to correspondingly excite the photodiodes. Therefore, since the laser light providing module can adopt a laser chip package structure without using the optical fiber, the laser chip package structure without using the optical fiber can provide a laser light source that has a light spot size larger than that of a laser light source provided by the laser chip package structure using an optical fiber. Moreover, since the laser light source can be transmitted without using the optical fiber, the stability of the laser light source provided by the laser chip package structure without using the optical fiber can be improved, thereby ensuring the measurement accuracy when measuring the electrical signal generated by the photodiode. Furthermore, since the beam quantity adjuster can be used to divide or convert the laser light source into a plurality of projection beams so as to detect the photodiodes at the same time, the detection efficiency of a large number of photodiodes can be improved during the detection of the photodiodes. In this way, the present disclosure can provide a laser light providing module that can detect the plurality of photodiodes at the same time, which can not only ensure the measurement accuracy of the photodiode, but also improve the detection efficiency of the large number of photodiodes.

In one of the possible or preferred embodiments, the laser light providing module includes a module carrier configured for carrying the laser chip package structure, the first optical lens and the beam quantity adjuster, and the laser chip package structure, the first optical lens and the beam quantity adjuster are integrated into a single optical component by the module carrier. In which, the laser chip package structure includes a package casing, two conductive pins partially exposed from the package casing, and a laser light-emitting diode chip disposed inside the package casing. In which, the beam quantity adjuster is a spatial light modulator or a beam distribution element having at least two through openings. In which, when the beam quantity adjuster is the beam distribution element, the first optical lens is configured for parallelly guiding the laser beam to project onto the at least two through openings, so that the at least two through openings are completely covered by the laser beam. In which, when the beam quantity adjuster is the beam distribution element, the beam distribution element is configured for allowing a part of the laser beam to pass through the at least two through openings so as to correspondingly form at least two projection beams, and a shortest distance between the at least two through openings is equal to a shortest distance between the at least two projection beams. In which, when the beam quantity adjuster is the beam distribution element, a size and a shape of the light spot projected by the projection beam on the active region of the photodiode are respectively changed according to a size and a shape of the through opening of the beam distribution element. In which, when the beam quantity adjuster is the spatial light modulator, the spatial light modulator is configured for allowing the laser beam to pass through or for reflecting the laser beam, thereby converting the laser beam into the at least two projection beams, and the spatial light modulator is configured for adjusting the shortest distance between the two projection beams, a quantity of the projection beams, and the size and the shape of the light spot of the projection beam.

In the above-mentioned possible or preferred embodiments, since the laser chip package structure, the first optical lens and the beam quantity adjuster can be integrated into a single modular optical component through the module carrier, it is more convenient for the modular laser light providing module to be used in the optical detection system. In addition, the laser chip package structure uses the laser light-emitting diode chip that has been packaged by the package casing, and the laser chip package structure without connecting an optical fiber can provide a laser light source with a larger light spot, so that the stability of the laser light source provided by the laser chip package structure without using the optical fiber can be improved, thereby ensuring the measurement accuracy when measuring the electrical signal generated by the photodiode.

More particularly, when the beam quantity adjuster is a beam distribution element having the at least two through openings, the quantity of the projection beams provided by the laser light providing module can be determined according to the quantity of the through openings of the beam distribution element. Therefore, the present disclosure can change the quantity of the through openings of the beam distribution element according to the quantity of the photodiodes that need to be detected synchronously, so that more than two photodiodes can simultaneously perform an electronic characteristic detection, thereby improving the detection efficiency of a large number of photodiodes. In addition, the shortest distance between the two projection beams can be changed by controlling the shortest distance between the two through openings (or the distance between the two through openings can be determined according to the distance between the two active regions of the two photodiodes), and the size and the shape of the light spot can be respectively changed by controlling the size and the shape of the through opening (or the size and the shape of the light spot can be determined according to the size and the shape of the through opening, respectively), so that the beam distribution element is more flexible in use, and can better meet the customized requirement.

More particularly, when the beam quantity adjuster is a spatial light modulator, the laser beam can be converted into at least two projection beams through the liquid crystal molecules provided by the spatial light modulator (such as a transmissive spatial light modulator or a reflective spatial light modulator), so that the detection efficiency of a large number of photodiodes can be improved (that is to say, the spatial light modulator can be configured for allowing the laser beam to pass through the liquid crystal molecules, so as to convert the laser beam into the at least two projection beams, thereby improving the detection efficiency of a large number of photodiodes). In addition, the shortest distance between the two projection beams, the size and the shape of the light spot, and the quantity of projection beams can all be adjusted by controlling the liquid crystal molecules of the spatial light modulator (that is to say, the spatial light modulator can be configured for adjusting the shortest distance between the two projection beams, the quantity of projection beams, and the size and the shape of the light spot of the projection beam), so that the spatial light modulator is more flexible in use, and can better meet the customized requirement.

In one of the possible or preferred embodiments, the optical detection system further includes a beam splitting module and an ambient light providing module. The beam splitting module is configured to be disposed between the carrier module, the laser light providing module and the image capturing module, and the beam splitting module includes a first beam splitting element and a second beam splitting element. The ambient light providing module includes an ambient light generating structure configured for generating an ambient light source, and a second optical lens configured to be disposed between the ambient light generating structure and the second beam splitting element. In which, the first beam splitting element is configured to be disposed between the carrier module and the second beam splitting element, and the second beam splitting element is configured to be disposed between the first beam splitting element, the ambient light providing module and the image capturing module. In which, when the at least two projection beams provided by the laser light providing module are reflected by the first beam splitting element, and respectively and correspondingly projected onto the two active regions of the two photodiodes, the at least two projection beams are respectively reflected by the two active regions of the two photodiodes so as to correspondingly form two reflected beams. In which, when the two reflected beams sequentially pass through the first beam splitting element and the second beam splitting element and then are projected onto the image capturing module, the image capturing module is configured for judging whether the light spot of the projection beam deviates from a predetermined position of the active region of the corresponding photodiode through the position information. In which, when the second optical lens is configured for converting the ambient light source into an ambient beam that is projected onto the second beam splitting element, the ambient beam sequentially passes through the second beam splitting element and the first beam splitting element and then is projected onto the two photodiodes, thereby providing the ambient illumination that is required by the two photodiodes.

In the above-mentioned possible or preferred embodiments, since the image capturing module can be configured for judging whether the light spot of the projection beam deviates from a predetermined position of the active region of the corresponding photodiode through the position information (for example, for judging whether the light spot of the projection beam is completely projected onto the active region of the photodiode, or for judging whether the size or the shape of the light spot of the projection beam conforms to a preset size or a preset shape), so that the alignment accuracy of the photodiode can be improved during the detection of the photodiode. Furthermore, since the ambient beam provided by the ambient light providing module can be projected onto the two photodiodes at the same time so as to provide the ambient illumination that is required by the two photodiodes, the image capturing module can more clearly identify the position of the light spot of the projection beam that is projected onto the active region of the photodiode.

In one of the possible or preferred embodiments, the optical detection system further includes another laser light providing module that is configured to be disposed above the carrier module. In which, the another laser light providing module includes another laser chip package structure without using another optical fiber, another first optical lens adjacent to the another laser chip package structure, and another beam quantity adjuster adjacent to the another first optical lens. In which, the another laser chip package structure is configured for generating another laser light source projected onto the another first optical lens, and the another first optical lens is configured for converting the another laser light source into another laser beam projected onto the beam quantity adjuster and the another beam quantity adjuster, and the beam quantity adjuster and the another beam quantity adjuster is configured for splitting the another laser beam into another two projection beams. In which, when the another two projection beams are simultaneously and correspondingly projected onto another two of the photodiodes, the image capturing module is configured for capturing another position information of another light spot projected by the another projection beam on another active region of a corresponding one of the another two photodiodes. In which, when each of the another two photodiodes is excited by a corresponding one of the another two projection beams to correspondingly generate another electrical signal, the electrical detection module is configured for simultaneously and electrically contacting the another two photodiodes so as to sequentially obtain the another electrical signals that are correspondingly generated by the another two photodiodes. In which, the two laser light sources respectively generated by the two laser chip package structures have different wavelength ranges.

In the above-mentioned possible or preferred embodiments, when the laser light sources respectively generated by the laser chip package structures have different wavelength ranges, the optical detection system provided by the present disclosure can be used to excite the photodiodes with different wavelength ranges according to different requirements, so that the optical detection system provided by the present disclosure can be suitable for detecting the photodiodes with different wavelength ranges, thereby enhancing the application of the photodiodes in different wavelength ranges.

In one of the possible or preferred embodiments, when the beam quantity adjuster is a spatial light modulator, the spatial light modulator is configured for allowing the laser beam to pass through or for reflecting the laser beam, thereby converting the laser beam into the at least two projection beams, and the spatial light modulator is configured for adjusting a position of the light spot of the projection beam. When different positions of the active region of the same photodiode are excited by the projection beam so as to respectively generate a plurality of different electrical signals, the electrical detection module is configured for electrically contacting the photodiode so as to obtain a plurality of different electrical signals of the photodiode, thereby calculating an average current value of the photodiode or determining a maximum current position of the active region of the photodiode.

In the above-mentioned possible or preferred embodiments, when the size of the light spot formed by the projection beam projected onto the active region of the photodiode is narrowed, the position of the light spot of the projection beam on the active region of the photodiode can be adjusted according to different requirements. Therefore, when the different positions of the active region of the same photodiode are excited by the projection beam so as to respectively generate the different electrical signals, the electrical detection module can be configured to calculate an average current value of the photodiode or determine a maximum current position of the active region of the photodiode through the different electrical signals, so that the different electrical signals obtained from the active region of the same photodiode can be optimized so as to meet the customized requirement.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
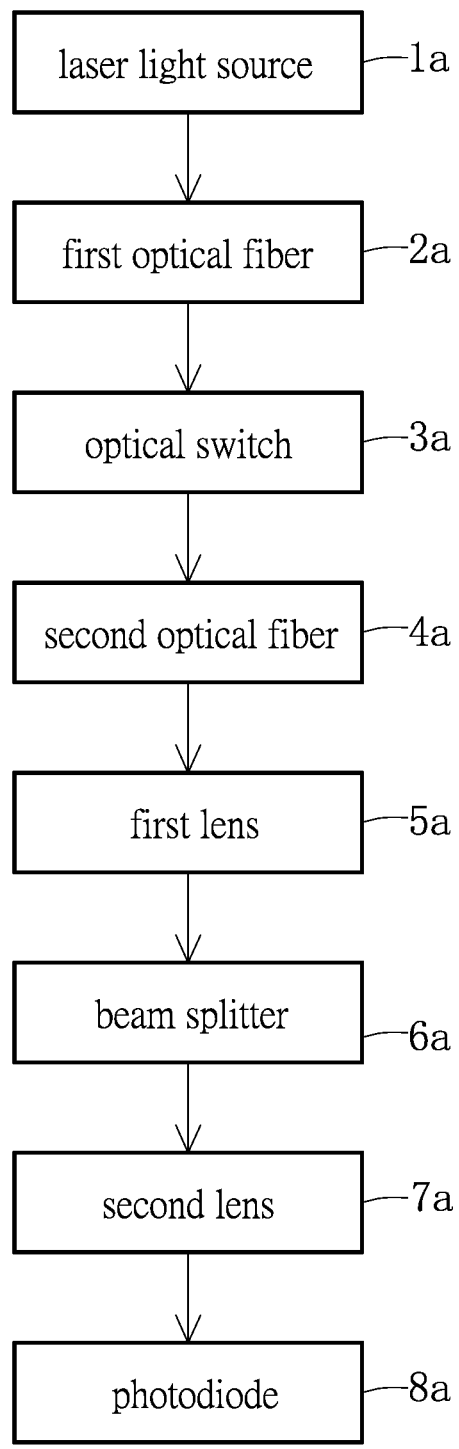
FIG. 1 is a functional block diagram (or a light path diagram) of a photodiode testing system of the related art.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
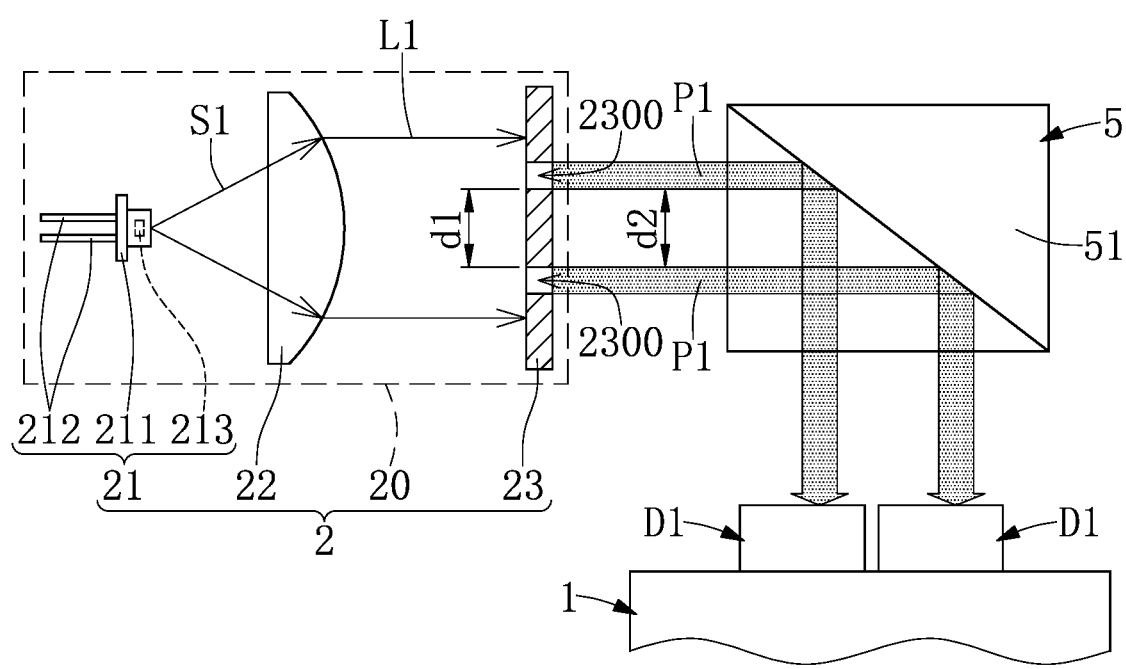
FIG. 2 is a schematic side view of an optical detection system according to a first embodiment of the present disclosure.
Figure 3:
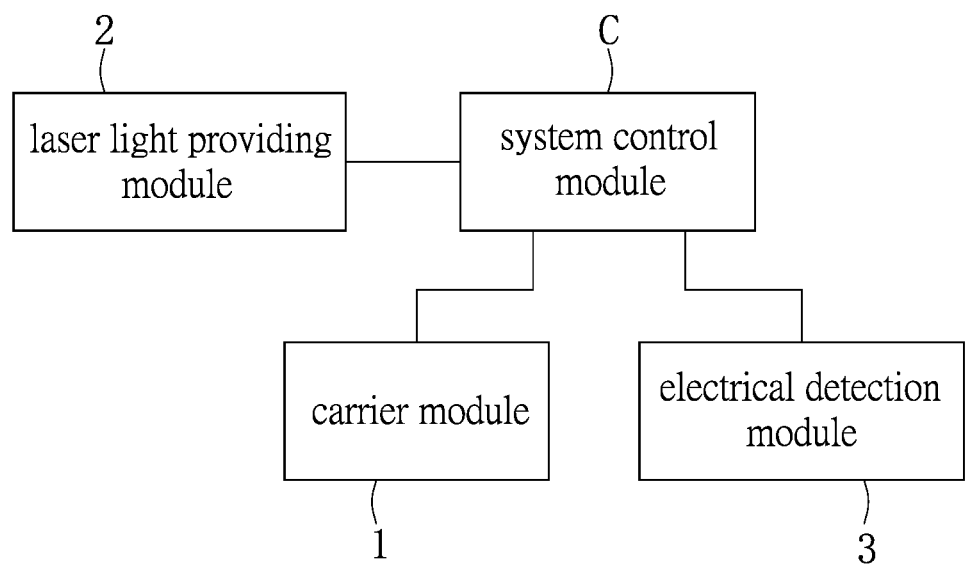
FIG. 3 is a functional block diagram of the optical detection system according to the first embodiment of the present disclosure.
Figure 4:
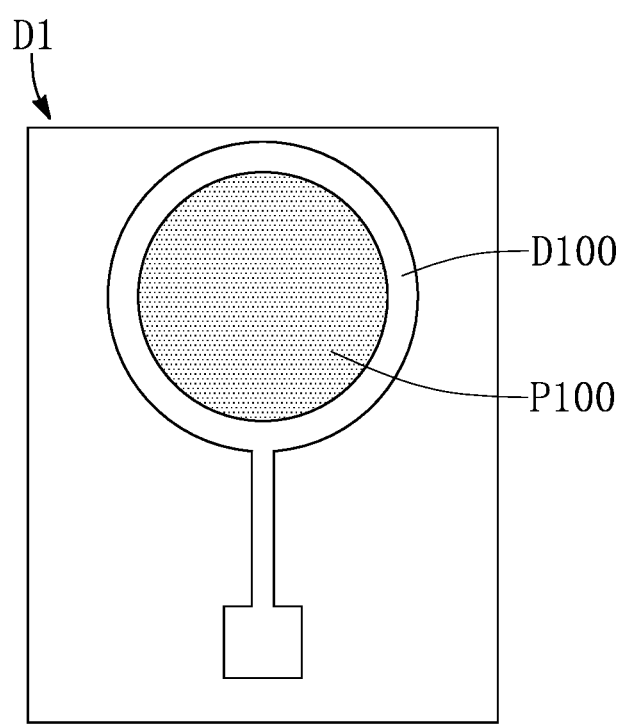
FIG. 4 is a schematic top view of a photodiode according to the present disclosure.

Referring to FIG. 2 to FIG. 4, a first embodiment of the present disclosure provides an optical detection system, which includes a carrier module 1, a laser light providing module 2 and an electrical detection module 3. For example, the carrier module 1, the laser light providing module 2 and the electrical detection module 3 can be electrically connected to a system control module C (such as a computer), and a user can use the system control module C to control the carrier module 1, the laser light providing module 2 and the electrical detection module 3 according to different requirements. However, the aforementioned details are disclosed for exemplary purposes only, and are not meant to limit the scope of the present disclosure.

Firstly, as shown in FIG. 2, the carrier module 1 can be configured for carrying a plurality of photodiodes D1. For example, the photodiodes D1 (only two photodiodes D1 are shown in FIG. 2 as an example) can be pre-fixed on a carrier substrate (not shown, such as a circuit substrate), and the carrier module 1 can be a carrier structure (such as an X-Y-Z slide table) for fixing the carrier substrate. However, the aforementioned details are disclosed for exemplary purposes only, and are not meant to limit the scope of the present disclosure.

Moreover, as shown in FIG. 2, the laser light providing module 2 can be configured to be disposed above the carrier module 1 (i.e., any position in an upper space area above the carrier module 1) or any position adjacent to the carrier module 1. In addition, the laser light providing module 2 includes a laser chip package structure 21 without using an optical fiber, a first optical lens 22 (or a first optical assembly including a plurality of lenses), and a beam quantity adjuster. In which, the first optical lens 22 can be disposed adjacent to the laser chip package structure 21 (or in a light transmission path, the first optical lens 22 can be located on a downstream optical path of the laser chip package structure 21), and the beam quantity adjuster can be disposed adjacent to the first optical lens 22 (or in the light transmission path, the beam quantity adjuster can be located on a downstream optical path of the first optical lens 22).

For example, as shown in FIG. 2, in a possible implementation aspect, the beam quantity adjuster can be a beam distribution element 23 having at least two through openings 2300 (such as through holes), and the laser light providing module 2 includes a module carrier 20 configured for carrying the laser chip package structure 21, the first optical lens 22 and the beam distribution element 23. Therefore, the laser chip package structure 21, the first optical lens 22 and the beam distribution element 23 can be integrated into a single optical component by the module carrier 20. It should be noted that the laser chip package structure 21 (such as a TO-Ca laser diode) includes a package casing 211, two conductive pins 212 and a laser light-emitting diode chip 213, and the laser chip package structure 21 can be used to provide a laser light source S1 without using an optical fiber. In which, a part of each of the two conductive pins 212 can be exposed from the package casing 211 for receiving an external power source, and the laser light-emitting diode chip 213 can be disposed inside the package casing 211 and is electrically connected to the two conductive pins 212. However, the aforementioned details are disclosed for exemplary purposes only, and are not meant to limit the scope of the present disclosure.

Furthermore, referring to FIG. 2 and FIG. 3, the electrical detection module 3 can be configured to be disposed at any position adjacent to the carrier module 1. For example, the electrical detection module 3 may include a movable structure (not shown) and a plurality of conductive probes (not shown) that can be driven by the movable structure to move at a predetermined position. The conductive probe can be used to selectively and electrically contact the conductive pads of the photodiodes D1 at the same time, and then sequentially obtain the electrical signal generated by each of the photodiodes D1, or simultaneously obtain the electrical signal generated by each of the photodiodes D1. However, the aforementioned details are disclosed for exemplary purposes only, and are not meant to limit the scope of the present disclosure.

For example, referring to FIG. 2 and FIG. 4, when the laser chip package structure 21 is configured for generating a laser light source S1 projected onto the first optical lens 22, the first optical lens 22 can be configured for converting the laser light source S1 into a laser beam L1 projected onto the beam distribution element 23, and the beam distribution element 23 can be configured for splitting the laser beam L1 into a plurality of projection beams P2 (such as at least two projection beams P2). More particularly, when the first optical lens 22 is configured for converting the non-parallel laser light source S1 into the parallel laser beam L1, and then parallelly guiding the parallel laser beam L1 to project onto the at least two through openings 2300, the at least two through openings 2300 can be completely covered by the laser beam L1 (That is to say, a projection range of the laser beam L1 is larger than a range distributed by the at least two through openings 2300). In addition, when the beam distribution element 23 is configured for allowing a part of the laser beam L1 to pass through the at least two through openings 2300 (that is to say, the other part of the laser beam L1 is blocked from passing through the beam distribution element 23), the part of the laser beam L1 can be distributed into at least two projection beams P2 through the at least two through openings 2300, respectively. Moreover, the at least two projection beams P1 provided by the laser light providing module 2 can be reflected by a first beam splitting element 51 of a beam splitting module 5, and then be respectively and correspondingly projected onto the two active regions D100 (or two light sensing regions) of the two photodiodes D1 (that is to say, a projection beam P1 can only be projected onto the active region D100 of a corresponding one of the photodiodes D1), and each projection beam P1 has a light spot P100 projected onto the active region D100 of the corresponding photodiode D1. It should be noted that, thousands of photodiodes D1 to be tested can be configured to be carried by the carrier module 1, and the beam distribution element 23 can be configured to divide the laser beam L1 into tens of projection beams P1. The tens of projection beams P1 can be simultaneously and correspondingly projected on tens of photodiodes D1 (i.e., one batch of the tens of photodiodes D1 to be detected) of the thousands of photodiodes D1 disposed on the carrier module 1 so as to optically detect the tens of photodiodes D1, and then by repeating the above-mentioned optical detection for each batch of the tens of photodiodes D1 until all the thousands of photodiodes D1 disposed on the carrier module 1 have completed the optical detection. However, the aforementioned details are disclosed for exemplary purposes only, and are not meant to limit the scope of the present disclosure.

According to the above description, it should be noted that, as shown in FIG. 2, a shortest distance d1 between the at least two through openings 2300 is substantially equal to a shortest distance d2 between the at least two projection beams P1. That is to say, the shortest distance d2 between the two projection beams P1 can be changed by controlling the shortest distance d1 between the two through openings 2300 (or the distance between the two through openings 2300 can be determined according to the distance between the two active regions D100 of the two photodiodes D1). In addition, as shown in FIG. 2 and FIG. 4, a size and a shape of the light spot P100 projected onto the active region D100 of the corresponding photodiode D1 are substantially the same as or similar to a size (or diameter) and a shape (or distribution area) of the through opening 2300, respectively. That is to say, the size and the shape of the light spot P100 can be respectively changed by controlling the size and the shape of the through opening 2300 (or the size and the shape of the light spot P100 can be determined according to the size and the shape of the through opening 2300, respectively), so that the beam distribution element 23 is more flexible in use, and can better meet the customized requirement.

Therefore, as shown in FIG. 2, when at least two photodiodes D1 are respectively excited by the at least two projection beams P2 to respectively generate two electrical signals (that is to say, each of the photodiodes D1 is excited by a corresponding one of the projection beams P2 to correspondingly generate an electrical signal), the electrical detection module 3 can be configured for simultaneously and electrically contacting the two photodiodes D1 so as to sequentially or simultaneously obtain the electrical signals that are correspondingly generated by the two photodiodes D1, so that it is beneficial for the subsequent detection of the electronic properties (such as voltage or current) of the photodiode D1. It should be noted that the quantity of the projection beams P1 provided by the laser light providing module 2 can be equal to the quantity of the through openings 2300 of the beam distribution element 23. That is to say, the quantity of the projection beams P1 provided by the laser light providing module 2 can be determined according to the quantity of the through openings 2300 of the beam distribution element 23. Hence, in the present disclosure, the quantity of the through openings 2300 of the beam distribution element 23 can be changed according to the quantity of the photodiodes D1 that need to be detected synchronously, so that the electronic characteristics of more than two photodiodes D1 can be detected at the same time.

Figure 5:
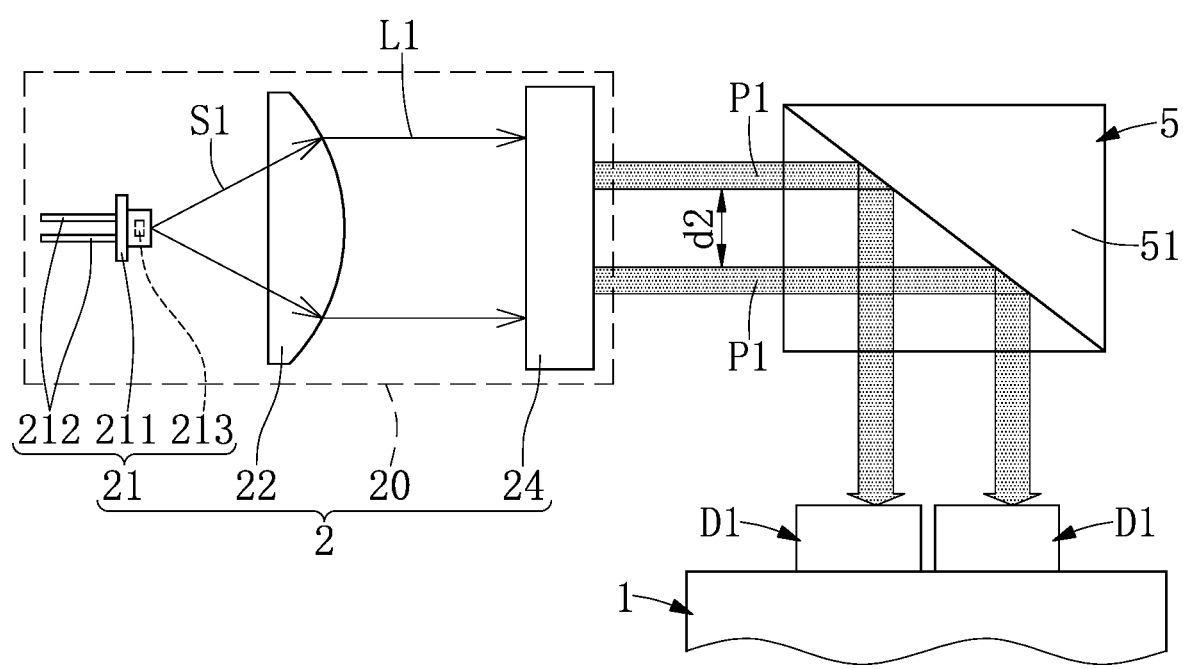
FIG. 5 is a schematic side view of another optical detection system according to the first embodiment of the present disclosure.

For example, referring to FIG. 2, FIG. 4 and FIG. 5, in another possible implementation aspect, the beam distribution element 23 having at least two through openings 2300 (as shown in FIG. 2) can be replaced with a spatial light modulator 24 (SLM) with liquid crystal molecules (as shown in FIG. 5) according to different requirements. It should be noted that the spatial light modulator 24 can be a transmissive spatial light modulator or a reflective spatial light modulator 24, and the main working principle of the spatial light modulator 24 is to reverse the optical axis direction of the liquid crystal molecules through an external electric field, so as to change the phase difference of the incident beam between the fast axis and the slow axis, thereby adjusting the polarization state and polarization angle of the incident beam. More particularly, when the first optical lens 22 is configured to guide the laser beam L1 to be directly projected onto the spatial light modulator 24 in parallel, the laser beam L1 can be converted by the liquid crystal molecules of the spatial light modulator 24 (such as a transmissive spatial light modulator) to form at least two projection beams P1 (that is to say, the spatial light modulator 24 can be configured for allowing the laser beam L1 to pass through the liquid crystal molecules, so as to convert the laser beam L1 into the at least two projection beams P1). Moreover, the at least two projection beams P1 provided by the laser light providing module 2 can be reflected by the first beam splitting element 51, and then be respectively and correspondingly projected onto the two active regions D100 of the two photodiodes D1 (that is to say, a projection beam P1 can only be projected onto the active region D100 of a corresponding one of the photodiodes D1). However, the aforementioned details are disclosed for exemplary purposes only, and are not meant to limit the scope of the present disclosure.

Figure 6:
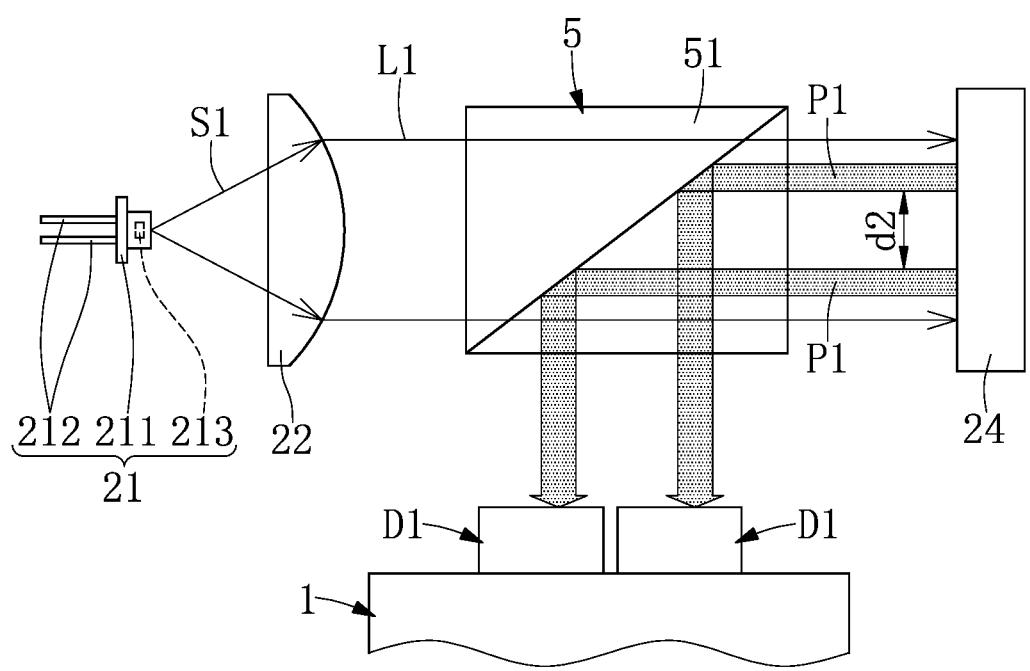
FIG. 6 is a schematic side view of yet another optical detection system according to the first embodiment of the present disclosure.

For example, referring to FIG. 4, FIG. 5 and FIG. 6, in another possible implementation aspect, the spatial light modulator 24 with the liquid crystal molecules can be switched from one side of the first light splitting element 51

(as shown in FIG. 5, the spatial light modulator 24 being disposed between the first optical lens 22 and the first beam splitting element 51) to the other side of the first light splitting element 51 (as shown in FIG. 6, the first beam splitting element 51 being disposed between the first optical lens 22 and the spatial light modulator 24) according to different requirements. More particularly, when the first optical lens 22 is configured to guide the laser beam L1 to parallelly pass through the first beam splitting element 51 and then project on the spatial light modulator 24, the laser beam L1 can be converted by the liquid crystal molecules of the spatial light modulator 24 (such as a reflective spatial light modulator) to form at least two projection beams P1 (that is to say, the spatial light modulator 24 can be configured for reflecting the laser beam L1, so as to convert the laser beam L1 into the at least two projection beams P1). Moreover, the at least two projection beams P1 provided by the laser light providing module 2 can be reflected by the first beam splitting element 51, and then be respectively and correspondingly projected onto the two active regions D100 of the two photodiodes D1 (that is to say, a projection beam P1 can only be projected onto the active region D100 of a corresponding one of the photodiodes D1). However, the aforementioned details are disclosed for exemplary purposes only, and are not meant to limit the scope of the present disclosure.

It should be noted that, as shown in FIG. 5 or FIG. 6, when the beam quantity adjuster can be a spatial light modulator 24 with the liquid crystal molecules, the shortest distance d2 between the two projection beams P1, the size and the shape of the light spot P100, and the quantity of the projection beam P1 can be adjusted by controlling the liquid crystal molecules of the spatial light modulator 24. That is to say, the spatial light modulator 24 can be configured to adjust the shortest distance d2 between the two projection beams P1, the quantity of the projection beams P1, and the size and the shape of the light spot P100 of the projection beam.

Figure 7:
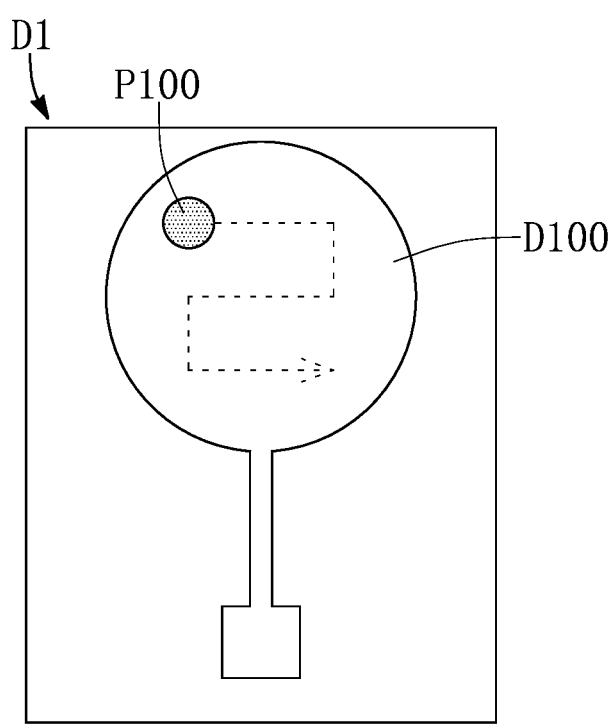
FIG. 7 is a schematic top view of a light spot moved along a dotted line to excite different positions of an active area of the photodiode according to the present disclosure.

For example, referring to FIG. 5 and FIG. 6, in another possible implementation aspect, when the beam quantity adjuster is a spatial light modulator 24, the spatial light modulator 24 can be configured for allowing the laser beam L1 to pass through or for reflecting the laser beam L1, thereby converting the laser beam L1 into the at least two projection beams P1. In addition, when the size of the light spot P100 formed by the projection beam P1 projected onto the active region D100 of the photodiode D1 is narrowed, the position of the light spot P100 of the projection beam P1 on the active region D100 of the photodiode D1 can be adjusted according to different requirements (that is to say, the spatial light modulator 24 can be configured for adjusting a position of the light spot P100 of the projection beam P1). More particularly, when the different positions of the active region D100 of the same photodiode D1 are excited by the projection beam P1 so as to respectively generate the different electrical signals (for example, the light spot P100 of the projection beam P1 can be moved along a dotted line in FIG. 7 to excite different positions of the active area D100), the electrical detection module 3 can be configured for electrically contacting the photodiode D1 so as to obtain a plurality of different electrical signals of the photodiode D1, thereby calculating an average current value (or average voltage value) of the photodiode D1 or determining a maximum current position (or maximum voltage position) of the active region D100 of the photodiode D1. That is to say, the electrical detection module 3 can be configured to calculate an average current value of the photodiode D1 or determine a maximum current position of the active region D100 of the photodiode D1 through the different electrical signals, so that the different electrical signals obtained from the active region D100 of the same photodiode D1 can be optimized so as to meet the customized requirement. However, the aforementioned details are disclosed for exemplary purposes only, and are not meant to limit the scope of the present disclosure.

Second Embodiment

Figure 8:
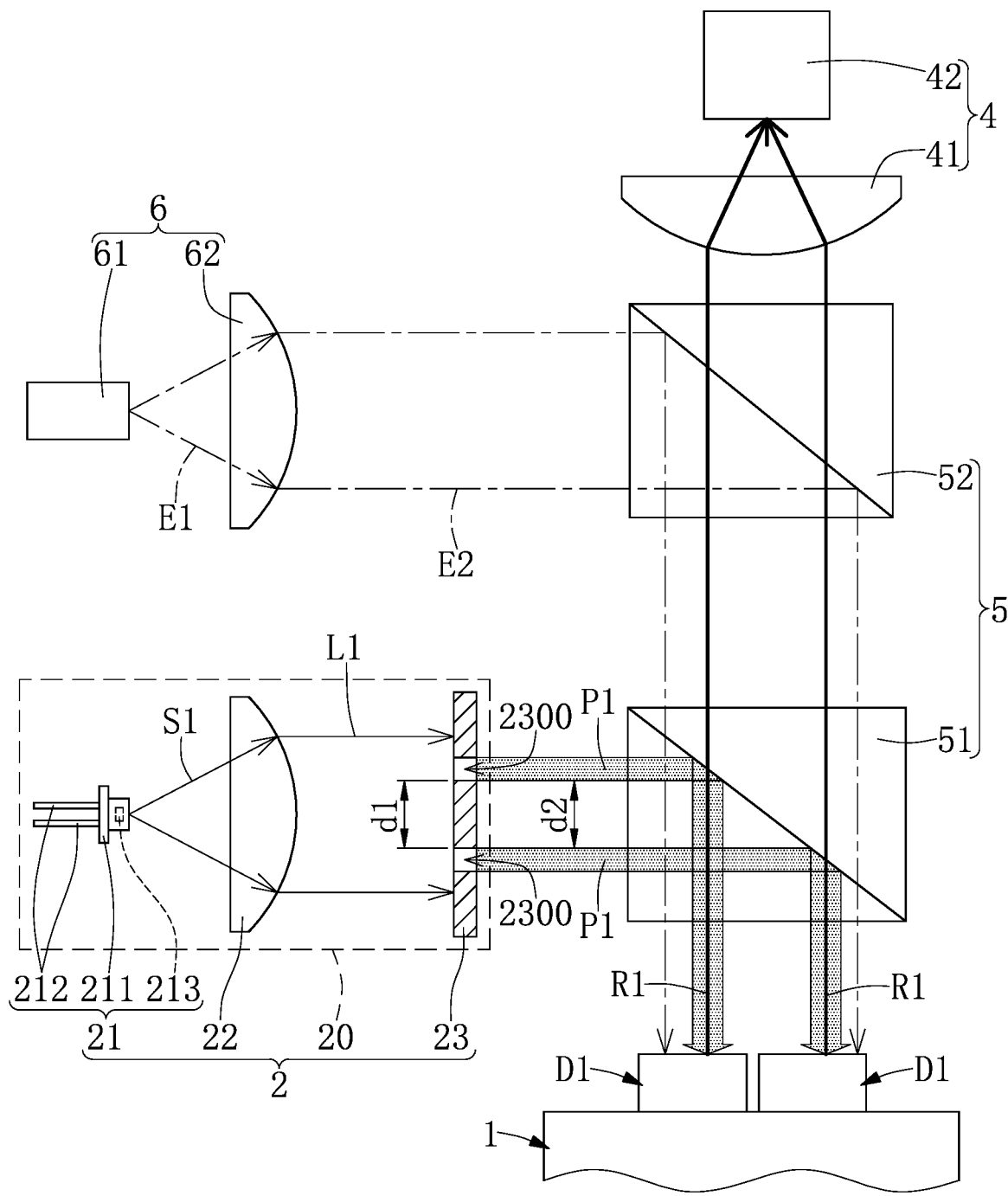
FIG. 8 is a schematic side view of the optical detection system according to a second embodiment of the present disclosure.
Figure 9:
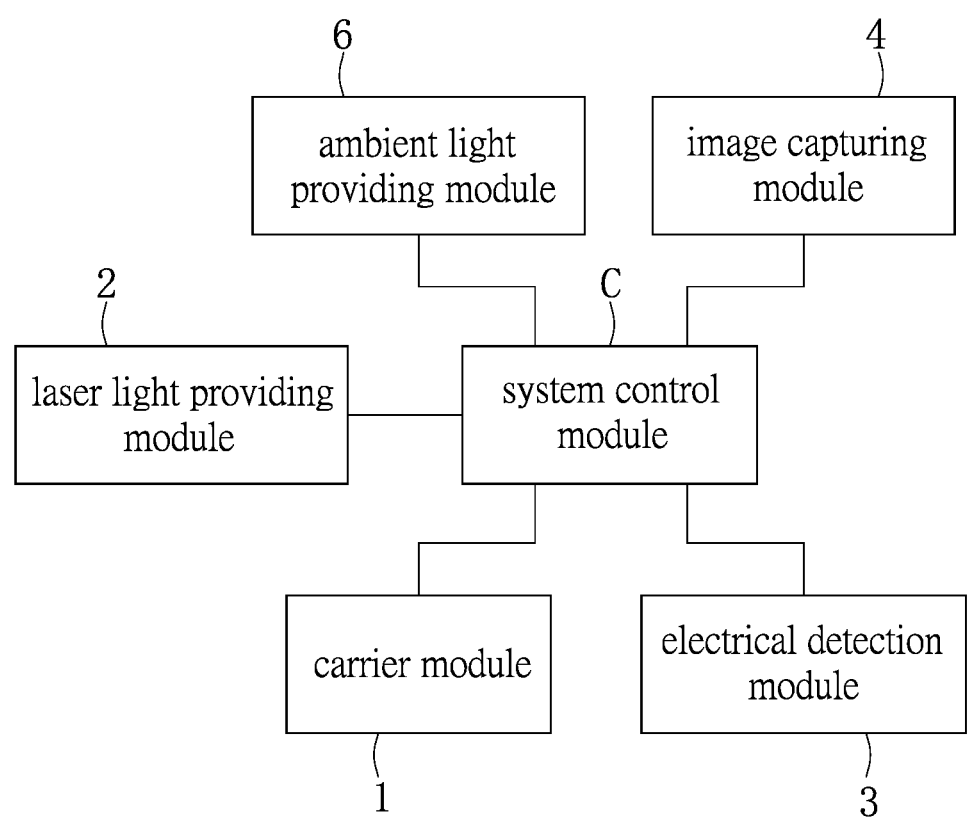
FIG. 9 is a functional block diagram of the optical detection system according to the second embodiment of the present disclosure.

Referring to FIG. 8 and FIG. 9, a second embodiment of the present disclosure provides an optical detection system, which includes a carrier module 1, a laser light providing module 2 and an electrical detection module 3. Comparing FIG. 8 with FIG. 2, and comparing FIG. 9 with FIG. 3, the main difference between the second embodiment and the first embodiment is as follows: the optical detection system of the second embodiment further includes an image capturing module 4 that is configured to be disposed above the carrier module 1 (i.e., any position in an upper space area above the carrier module 1) or any position adjacent to the carrier module 1. Therefore, referring to FIG. 4 and FIG. 8, when at least two projection beams P1 are simultaneously and correspondingly projected onto two photodiodes D1 (that is to say, a projection beam P1 can only be projected onto a corresponding one of the photodiodes D1), the image capturing module 4 can be configured for capturing position information of a light spot P100 projected by the projection beam P1 on an active region D100 of a corresponding one of the photodiodes D1.

For example, as shown in FIG. 8, the image capturing module 4 includes a focusing lens 41 (or a focusing lens group) and an image sensor 42 (such as using a CCD or CMOS sensor chip) that can cooperate with the focusing lens 41. In addition, as shown in FIG. 9, the carrier module 1, the laser light providing module 2, the electrical detection module 3 and the image capturing module 4 can be electrically connected to a system control module C (such as a computer), and a user can use the system control module C to control the carrier module 1, the laser light providing module 2, the electrical detection module 3 and the image capturing module 4 according to different requirements. However, the aforementioned details are disclosed for exemplary purposes only, and are not meant to limit the scope of the present disclosure.

For example, referring to FIG. 4 and FIG. 8, the optical detection system further includes a beam splitting module 5 and an ambient light providing module 6. In terms of spatial configuration, the beam splitting module 5 can be configured to be disposed between the carrier module 1, the laser light providing module 2, the image capturing module 4 and ambient light providing module 6 (or the carrier module 1, the laser light providing module 2, the image capturing module 4, the beam splitting module 5 and ambient light providing module 6 can be configured to be arranged on the same optical path), and the beam splitting module 5 includes a first beam splitting element 51 and a second beam splitting element 52. In addition, the ambient light providing module 6 includes an ambient light generating structure 61 (such as an LED light source generator or other lighting source generator) configured for generating an ambient light source E1, and a second optical lens 62 (or a second optical assembly including a plurality of lenses) configured to be disposed between the ambient light generating structure 61 and the second beam splitting element 52. More particularly, in terms of spatial configuration, the first beam splitting element 51 can be configured to be disposed between the carrier module 1 and the second beam splitting element 52, and the second beam splitting element 52 can be configured to be disposed between the first beam splitting element 51, the ambient light providing module 6 and the image capturing module 4. However, the aforementioned details are disclosed for exemplary purposes only, and are not meant to limit the scope of the present disclosure.

For example, referring to FIG. 4 and FIG. 8, when the at least two projection beams P1 provided by the laser light providing module 2 are reflected by the first beam splitting element 51, and respectively and correspondingly projected onto the two active regions D100 of the two photodiodes D1 (that is to say, a projection beam P1 can only be projected onto the active region D100 of a corresponding one of the photodiodes D1), the at least two projection beams P1 can be respectively reflected by the two active regions D100 of the two photodiodes D1 so as to correspondingly form two reflected beams R1. Moreover, when the two reflected beams R1 sequentially pass through the first beam splitting element 51 and the second beam splitting element 52 and then are projected onto the image capturing module 4, the image capturing module 4 (which can be used with the system control module C) can be configured for judging whether the light spot P100 of the projection beam P1 deviates (or offsets) from a predetermined position of the active region D100 of the corresponding photodiode D1 through the position information (i.e., the position information of the light spot P100 of the projection beam P1 on the active region D100 of the photodiode D1). For example, the image capturing module 4 can be configured for judging whether the light spot P100 of the projection beam P1 is completely projected onto the active region D100 of the photodiode D1, or for judging whether the size or the shape of the light spot P100 of the projection beam P1 conforms to a preset size or a preset shape, so that the alignment accuracy of the photodiode D1 can be improved during the detection of the photodiode D1. However, the aforementioned details are disclosed for exemplary purposes only, and are not meant to limit the scope of the present disclosure.

It should be noted that when the second optical lens 62 is configured for converting the ambient light source E1 into an ambient beam E2 that is projected onto the second beam splitting element 52, the ambient beam E2 sequentially passes through the second beam splitting element 52 and the first beam splitting element 51 and then is projected onto the two photodiodes D1, thereby providing the ambient illumination that is required by the two photodiodes D1. Therefore, the ambient beam E2 provided by the ambient light providing module 6 can be projected onto the two photodiodes D1 at the same time so as to provide the ambient illumination that is required by the two photodiodes D1, so that the image capturing module 4 can more clearly identify the position of the light spot P100 of the projection beam P1 that is projected onto the active region D100 of the photodiode D1.

Third Embodiment

Referring to FIG. 10 to FIG. 13, a third embodiment of the present disclosure provides an optical detection system, which includes a carrier module 1, a laser light providing module 2, an electrical detection module 3 and an image capturing module 4, and the functions of the carrier module 1, the laser light providing module 2, the electrical detection module 3 and the image capturing module 4 are the same as those of the second embodiment. Comparing FIG. 10 (or FIG. 11) with FIG. 8, and comparing FIG. 12 with FIG. 9, the main difference between the third embodiment and the second embodiment is as follows: the optical detection system of the third embodiment further includes another laser light providing module 7 that is configured to be disposed above the carrier module 1 (i.e., any position in an upper space area above the carrier module 1) or any position adjacent to the carrier module 1, and electrically connected to the system control module C. Moreover, the another laser light providing module 7 includes another laser chip package structure 71 without using another optical fiber, another first optical lens 72 adjacent to the another laser chip package structure 71, and another beam quantity adjuster adjacent to the another first optical lens 72.

For example, in a possible implementation aspect, the another beam quantity adjuster can be another beam distribution element 73 having at least another two through openings 7300 (such as through holes), and the another laser light providing module 7 includes another module carrier 70 configured for carrying another laser chip package structure 71, another first optical lens 72 and another beam distribution element 73. Therefore, the another laser chip package structure 71, the another first optical lens 72 and the another beam distribution element 73 can be integrated into a single optical component by the another module carrier 70. It should be noted that the another laser chip package structure 71 (such as a TO-Ca laser diode) includes another package casing 711, another two conductive pins 712 and another laser light-emitting diode chip 713, and the another laser chip package structure 71 can be used to provide another laser light source S2 without using another optical fiber. In which, a part of each of the another two conductive pins 712 can be exposed from the another package casing 711 for receiving an external power source, and the another laser light-emitting diode chip 713 can be disposed inside the another package casing 711 and is electrically connected to the another two conductive pins 712. It should be noted that, referring to FIG. 10 and FIG. 11, the beam distribution element 23 having at least two through openings 2300, and/or the another beam distribution element 73 having the at least another two through openings 7300 can be replaced with a spatial light modulator 24 (SLM) with liquid crystal molecules (as shown in the first embodiment of FIG. 5 or FIG. 6) according to different requirements. However, the aforementioned details are disclosed for exemplary purposes only, and are not meant to limit the scope of the present disclosure.

Figure 11:
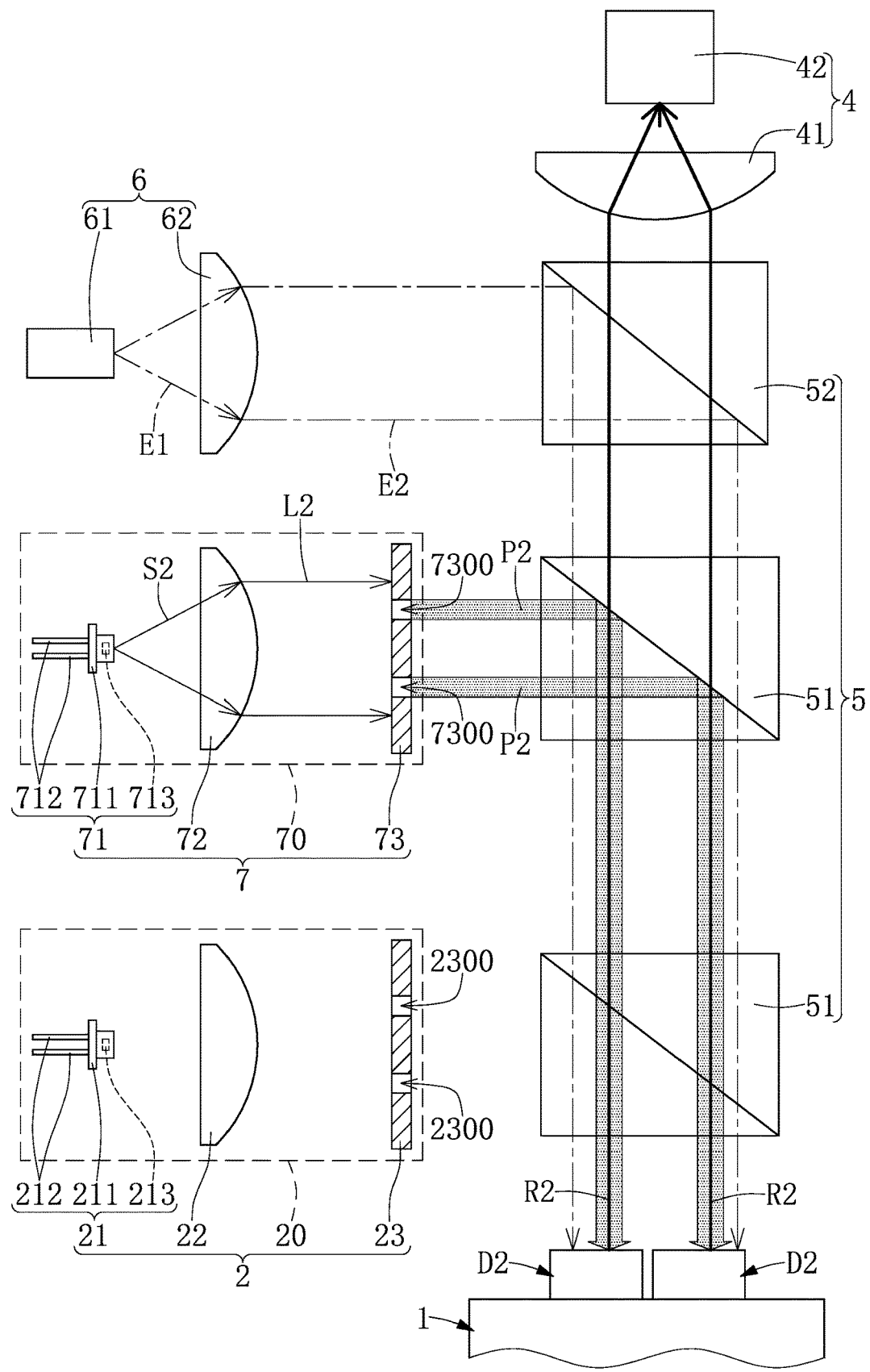
FIG. 11 is a schematic side view of the optical detection system according to the third embodiment of the present disclosure (when another one of the laser light providing modules is turned on)
Figure 12:
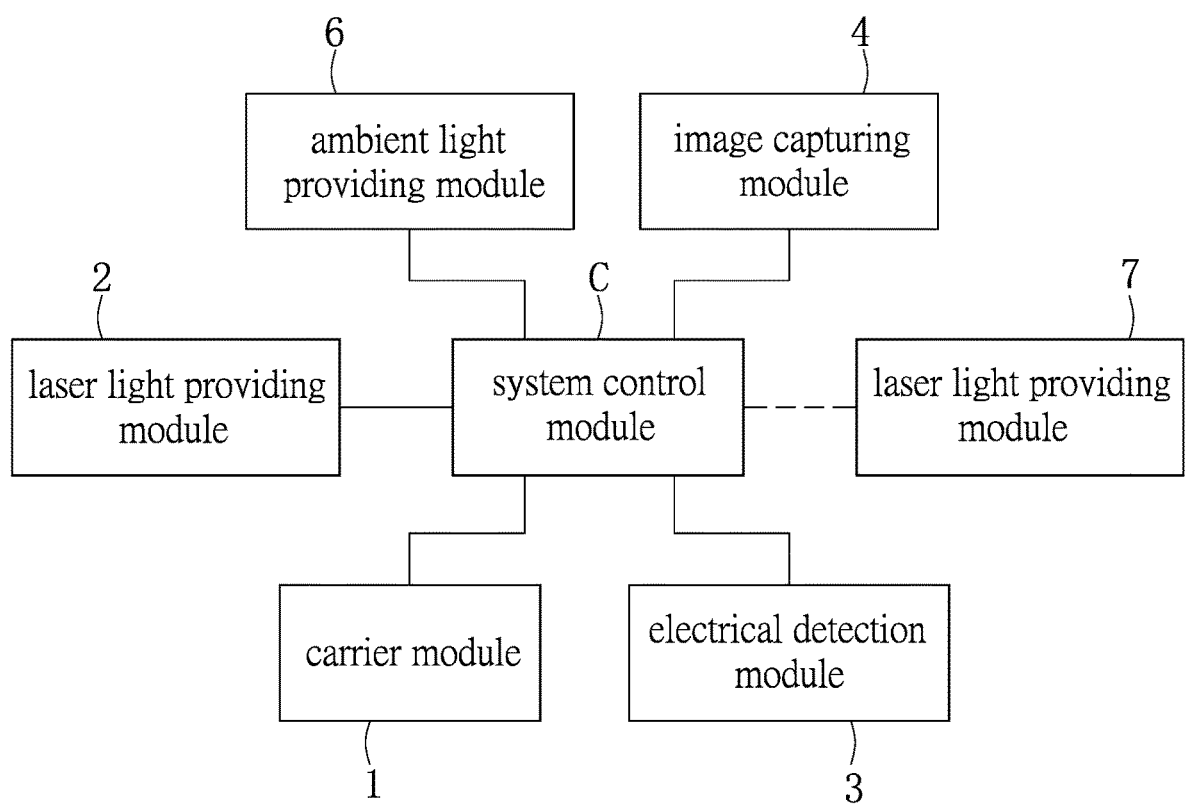
FIG. 12 is a functional block diagram of the optical detection system according to the third embodiment of the present disclosure.
Figure 13:
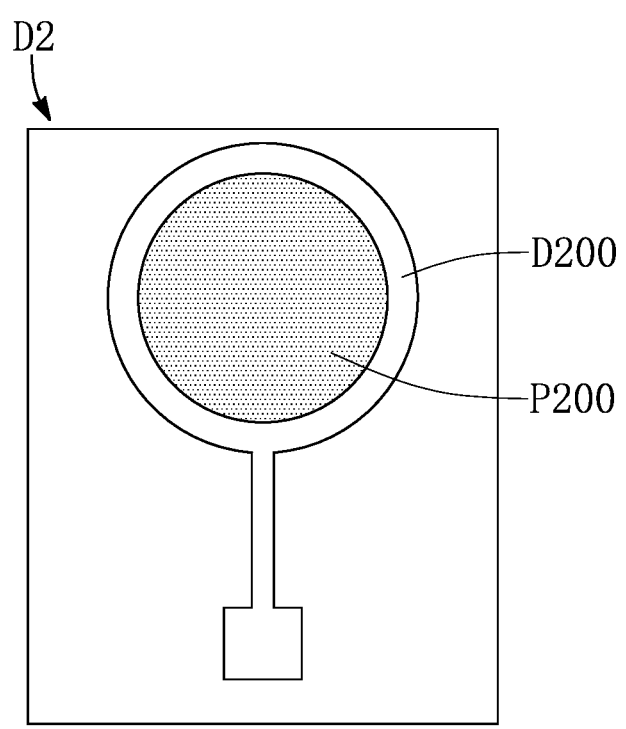
FIG. 13 is a schematic top view of another photodiode according to the present disclosure.

For example, referring to FIG. 11 and FIG. 13, the another laser chip package structure 71 can be configured for generating another laser light source S2 projected onto the another first optical lens 72, the another first optical lens 72 can be configured for converting the another laser light source S2 into another laser beam L2 projected onto the another beam distribution element 73, and the another beam distribution element 73 can be configured for splitting the another laser beam L2 into a plurality of projection beams P2 (such as at least two projection beams P2). Therefore, when the at least another two photodiodes D2 are respectively excited by the at least two projection beams P2 to respectively generate two electrical signals (that is to say, each of the another photodiodes D2 is excited by a corresponding one of the another projection beams P2 to correspondingly generate an electrical signal), the electrical detection module 3 can be configured for simultaneously and electrically contacting the another two photodiodes D2 so as to sequentially or simultaneously obtain the electrical signals that are correspondingly generated by the another two photodiodes D2, so that it is beneficial for the subsequent detection of the electronic properties (such as voltage or current) of the another photodiode D2.

For example, referring to FIG. 11 and FIG. 13, when the at least another two projection beams P2 are simultaneously and correspondingly projected onto the another two photodiodes D2 (that is to say, another projection beam P2 can only be projected onto a corresponding one of the another photodiodes D2), the image capturing module 4 can be configured for capturing position information of another light spot P200 projected by the another projection beam P2 on another active region D200 of a corresponding one of the another photodiodes D2. More particularly, when the at least another two projection beams P2 provided by the another laser light providing module 7 are reflected by the first beam splitting element 51, and respectively and correspondingly projected onto the another two active regions D200 of the another two photodiodes D2 (that is to say, another projection beam P2 can only be projected onto the another active region D200 of a corresponding one of the another photodiodes D2), the at least another two projection beams P2 can be respectively reflected by the another two active regions D200 of the another two photodiodes D2 so as to correspondingly form another two reflected beams R2. Moreover, when the another two reflected beams R2 sequentially pass through the first beam splitting element 51 and the second beam splitting element 52 and then are projected onto the image capturing module 4, the image capturing module 4 (which can be used with the system control module C) can be configured for judging whether the another light spot P200 of the another projection beam P2 deviates (or offsets) from a predetermined position of the another active region D200 of the corresponding another photodiode D2 through the position information (i.e., the position information of the another light spot P200 of the another projection beam P2 on the another active region D200 of the another photodiode D2). For example, the image capturing module 4 can be configured for judging whether the another light spot P200 of the another projection beam P2 is completely projected onto the another active region D200 of the another photodiode D2, or for judging whether the size or the shape of the another light spot P200 of the another projection beam P2 conforms to a preset size or a preset shape, so that the alignment accuracy of the another photodiode D2 can be improved during the detection of the another photodiode D2. However, the aforementioned details are disclosed for exemplary purposes only, and are not meant to limit the scope of the present disclosure.

Figure 10:
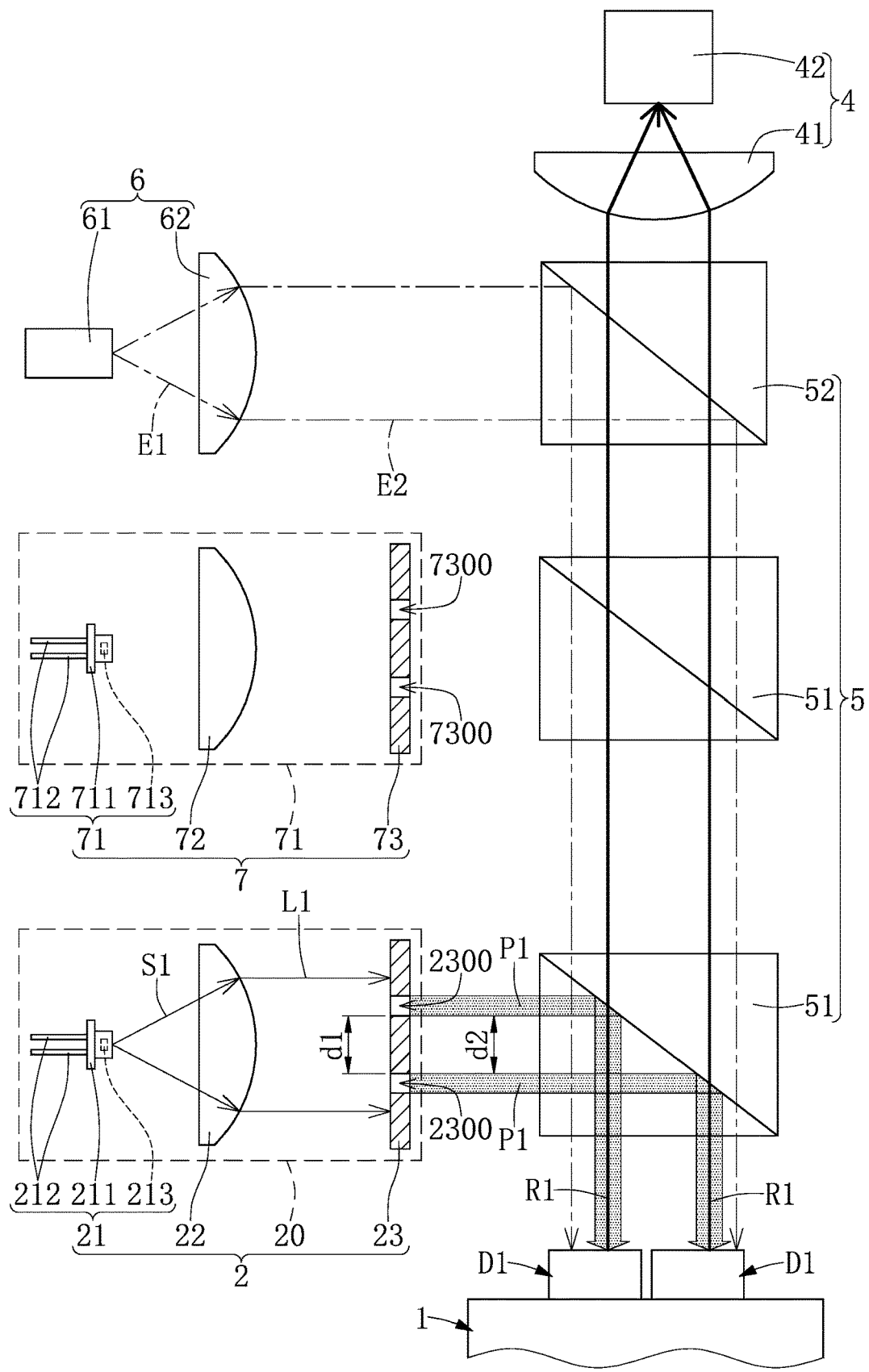
FIG. 10 is a schematic side view of the optical detection system according to a third embodiment of the present disclosure (when one of the laser light providing modules is turned on)

It should be noted that, referring to FIG. 10 and FIG. 11, the two laser light sources (S1, S2) respectively generated by the two laser chip package structures (21, 71) have different wavelength ranges, so that the optical detection system provided by the present disclosure can be used to excite the photodiodes (D1, D2) with different wavelength ranges according to different requirements. That is to say, the optical detection system provided by the present disclosure can be suitable for detecting the photodiodes (D1, D2) with different wavelength ranges, thereby enhancing the application of the photodiodes (D1, D2) in different wavelength ranges. For example, when the wavelength range of the photodiode D1 is exactly or about 1310 nm, the optical detection system provided by the present disclosure can select the laser chip package structure 21 to provide a laser light source S1 (i.e., the projection beam P1) with a wavelength range of exactly or about 1310 nm for exciting the photodiode D1. In addition, when the wavelength range of the another photodiode D2 is exactly or about 1550 nm, the optical detection system provided by the present disclosure can select the another laser chip package structure 71 to provide another laser light source S2 (i.e., the another projection beam P2) with a wavelength range of exactly or about 1550 nm for exciting the another photodiode D2. However, the aforementioned details are disclosed for exemplary purposes only, and are not meant to limit the scope of the present disclosure.

Figure 14:
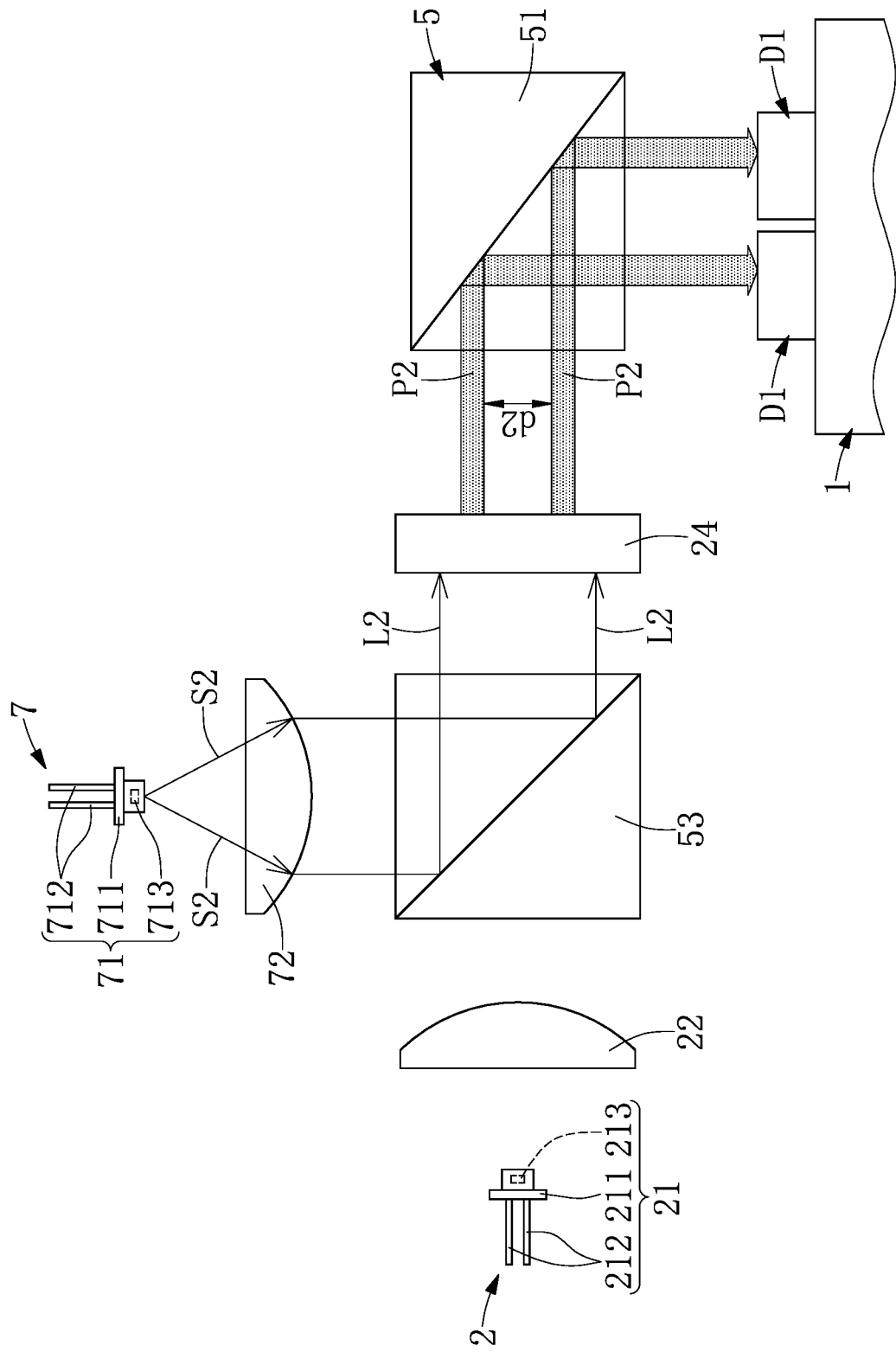
FIG. 14 is a schematic side view of another optical detection system according to the third embodiment of the present disclosure (when one of the laser light providing modules is turned on)
Figure 15:
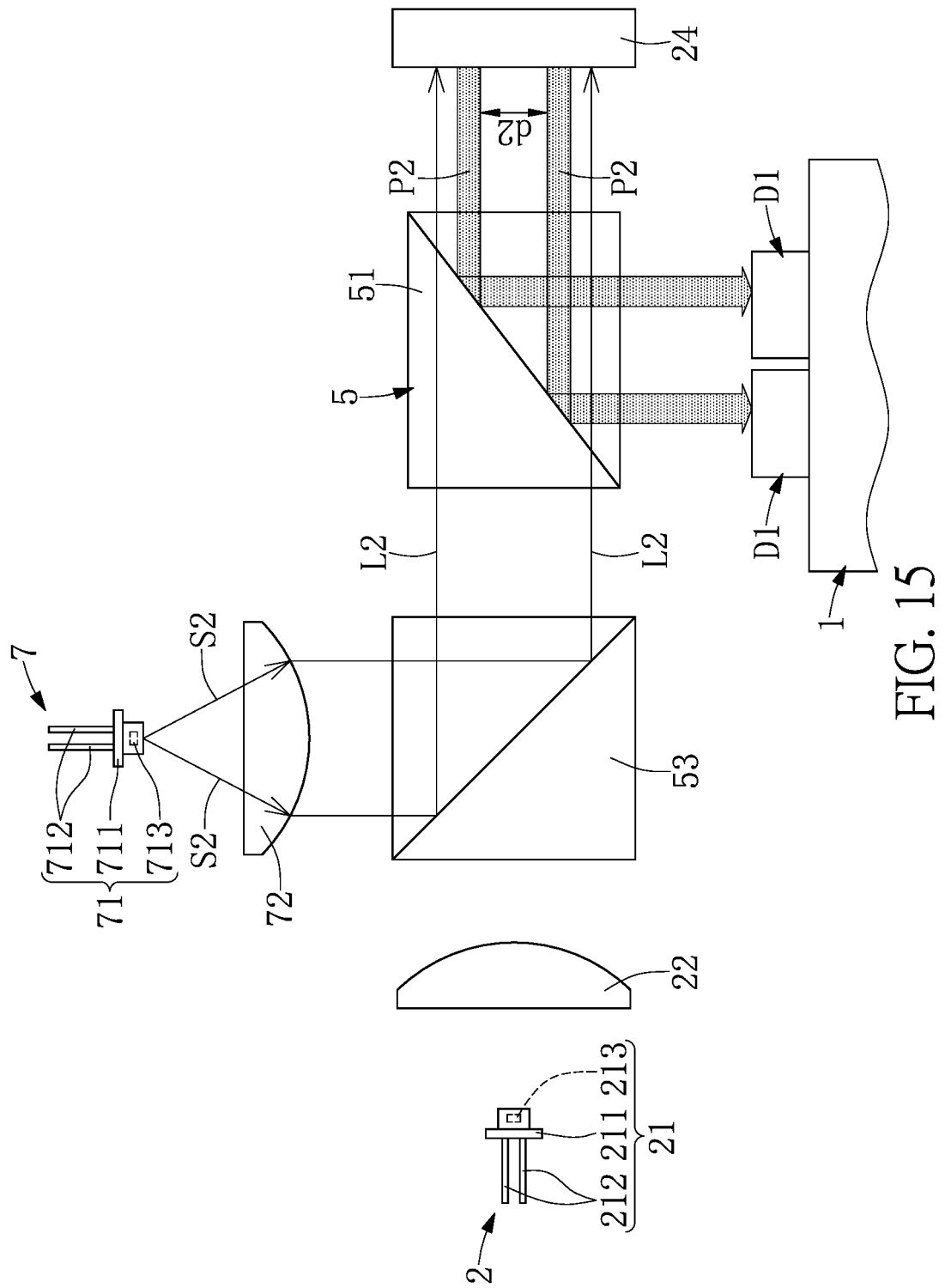
FIG. 15 is a schematic side view of yet another optical detection system according to the third embodiment of the present disclosure (when one of the laser light providing modules is turned on).

It should be noted that, referring to FIG. 14 and FIG. 15, the beam distribution element 23 having at least two through openings 2300, and/or the another beam distribution element 73 having the at least another two through openings 7300 can be replaced with a spatial light modulator 24 (SLM) with liquid crystal molecules, and the two laser light providing modules (2, 7) can use two spatial light modulators 24 respectively, or can also share the same spatial light modulator 24. For example, as shown in FIG. 14, when the spatial light modulator 24 is a transmissive spatial light modulator, firstly the another first optical lens 72 can be configured to convert another laser light source S2 into another laser beam L2, then the another laser beam L2 can be reflected by a third light-splitting element 53 and then projected onto the spatial light modulator 24, and finally the another laser beam L2 can be converted into at least two other projection beams P2 by the liquid crystal molecules of the spatial light modulator 24. In addition, when the spatial light modulator 24 is a reflective spatial light modulator, the another first optical lens 72 can be configured to convert another laser light source S2 into another laser beam L2, then the another laser beam L2 can pass through the third beam splitting element 53 and the first beam splitting element 51 in sequence and then project onto the spatial light modulator 24, and finally the another laser beam L2 can be converted into at least two other projected light beams P2 by the liquid crystal molecules of the spatial light modulator 24.

Beneficial Effects of the Embodiments

In conclusion, in the optical detection system provided by the present disclosure, by virtue of the laser light providing module 2 being provided without an optical fiber and the laser light providing module 2 being configured for converting a laser light source S1 into a plurality of projection beams P1 so as to simultaneously and correspondingly excite the photodiodes D1, the electrical detection module 3 can be configured for electrically contacting the photodiodes D1 so as to obtain an electrical signal generated by each of the photodiodes D1.

Furthermore, in the laser light providing module 2 without using an optical fiber provided by the present disclosure, by virtue of the laser chip package structure 21 being configured for generating a laser light source S1 projected onto the first optical lens 22, the first optical lens 22 being configured for converting the laser light source S1 into a laser beam L1 projected onto the beam quantity adjuster, and the beam quantity adjuster being configured for splitting the laser beam L1 into a plurality of projection beams P1 so as to simultaneously and correspondingly excite a plurality of photodiodes D1, the electrical detection module 3 can be configured for electrically contacting the photodiodes D1 so as to obtain an electrical signal generated by each of the photodiodes D1.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An optical detection system, comprising:
a carrier module configured for carrying a plurality of photodiodes;
a laser light providing module configured to be disposed above the carrier module;
an electrical detection module configured to be disposed adjacent to the carrier module; and
an image capturing module configured to be disposed above the carrier module;
wherein the laser light providing module includes a laser chip package structure without using an optical fiber, a first optical lens adjacent to the laser chip package structure, and a beam quantity adjuster adjacent to the first optical lens;
wherein the laser chip package structure is configured for generating a laser light source projected onto the first optical lens, and the first optical lens is configured for converting the laser light source into a laser beam projected onto the beam quantity adjuster, and the beam quantity adjuster is configured for splitting the laser beam into a plurality of projection beams;
wherein, when the projection beams are simultaneously and correspondingly projected onto the photodiodes, the image capturing module is configured for capturing position information of a light spot projected by the projection beam on an active region of a corresponding one of the photodiodes;
wherein, when each of the photodiodes is excited by a corresponding one of the projection beams to correspondingly generate an electrical signal, the electrical detection module is configured for simultaneously and electrically contacting the photodiodes so as to sequentially obtain the electrical signals that are correspondingly generated by the photodiodes.

2. The optical detection system according to claim 1,
wherein the laser light providing module includes a module carrier configured for carrying the laser chip package structure, the first optical lens and the beam quantity adjuster, and the laser chip package structure, the first optical lens and the beam quantity adjuster are integrated into a single optical component by the module carrier;
wherein the laser chip package structure includes a package casing, two conductive pins partially exposed from the package casing, and a laser light-emitting diode chip disposed inside the package casing;
wherein the beam quantity adjuster is a spatial light modulator or a beam distribution element having at least two through openings;
wherein, when the beam quantity adjuster is the beam distribution element, the first optical lens is configured for parallelly guiding the laser beam to project onto the at least two through openings, so that the at least two through openings are completely covered by the laser beam;
wherein, when the beam quantity adjuster is the beam distribution element, the beam distribution element is configured for allowing a part of the laser beam to pass through the at least two through openings so as to correspondingly form at least two projection beams, and a shortest distance between the at least two through openings is equal to a shortest distance between the at least two projection beams;
wherein, when the beam quantity adjuster is the beam distribution element, a size and a shape of the light spot projected by the projection beam on the active region of the photodiode are respectively changed according to a size and a shape of the through opening of the beam distribution element;
wherein, when the beam quantity adjuster is the spatial light modulator, the spatial light modulator is configured for allowing the laser beam to pass through or for reflecting the laser beam, thereby converting the laser beam into the at least two projection beams, and the spatial light modulator is configured for adjusting the shortest distance between the two projection beams, a quantity of the projection beams, and the size and the shape of the light spot of the projection beam.

3. The optical detection system according to claim 1, further comprising:
a beam splitting module configured to be disposed between the carrier module, the laser light providing module and the image capturing module, wherein the beam splitting module includes a first beam splitting element and a second beam splitting element; and
an ambient light providing module including an ambient light generating structure configured for generating an ambient light source, and a second optical lens configured to be disposed between the ambient light generating structure and the second beam splitting element;
wherein the first beam splitting element is configured to be disposed between the carrier module and the second beam splitting element, and the second beam splitting element is configured to be disposed between the first beam splitting element, the ambient light providing module and the image capturing module;
wherein, when the at least two projection beams provided by the laser light providing module are reflected by the first beam splitting element, and respectively and correspondingly projected onto the two active regions of the two photodiodes, the at least two projection beams are respectively reflected by the two active regions of the two photodiodes so as to correspondingly form two reflected beams;
wherein, when the two reflected beams sequentially pass through the first beam splitting element and the second beam splitting element and then are projected onto the image capturing module, the image capturing module is configured for judging whether the light spot of the projection beam deviates from a predetermined position of the active region of the corresponding photodiode through the position information;
wherein, when the second optical lens is configured for converting the ambient light source into an ambient beam that is projected onto the second beam splitting element, the ambient beam sequentially passes through the second beam splitting element and the first beam splitting element and then is projected onto the two photodiodes, thereby providing the ambient illumination that is required by the two photodiodes.

4. The optical detection system according to claim 1, further comprising:
another laser light providing module configured to be disposed above the carrier module;

wherein the another laser light providing module includes another laser chip package structure without using another optical fiber, another first optical lens adjacent to the another laser chip package structure, and another beam quantity adjuster adjacent to the another first optical lens;

wherein the another laser chip package structure is configured for generating another laser light source projected onto the another first optical lens, and the another first optical lens is configured for converting the another laser light source into another laser beam projected onto the beam quantity adjuster and the another beam quantity adjuster, and the beam quantity adjuster and the another beam quantity adjuster is configured for splitting the another laser beam into another two projection beams;

wherein, when the another two projection beams are simultaneously and correspondingly projected onto another two of the photodiodes, the image capturing module is configured for capturing another position information of another light spot projected by the another projection beam on another active region of a corresponding one of the another two photodiodes;

wherein, when each of the another two photodiodes is excited by a corresponding one of the another two projection beams to correspondingly generate another electrical signal, the electrical detection module is configured for simultaneously and electrically contacting the another two photodiodes so as to sequentially obtain the another electrical signals that are correspondingly generated by the another two photodiodes;

wherein the two laser light sources respectively generated by the two laser chip package structures have different wavelength ranges.

5. The optical detection system according to claim 1, wherein, when the beam quantity adjuster is a spatial light modulator, the spatial light modulator is configured for allowing the laser beam to pass through or for reflecting the laser beam, thereby converting the laser beam into the at least two projection beams, and the spatial light modulator is configured for adjusting a position of the light spot of the projection beam;

wherein, when different positions of the active region of the same photodiode are excited by the projection beam so as to respectively generate a plurality of different electrical signals, the electrical detection module is configured for electrically contacting the photodiode so as to obtain a plurality of different electrical signals of the photodiode, thereby calculating an average current value of the photodiode or determining a maximum current position of the active region of the photodiode.

6. An optical detection system, comprising:

a carrier module configured for carrying a plurality of photodiodes;

a laser light providing module provided without using an optical fiber and configured to be disposed above the carrier module; and an electrical detection module configured to be disposed adjacent to the carrier module;

wherein the laser light providing module is configured for converting a laser light source into a plurality of projection beams so as to simultaneously and correspondingly excite the photodiodes;

wherein the electrical detection module is configured for electrically contacting the photodiodes so as to obtain an electrical signal generated by each of the photodiodes.

7. The optical detection system according to claim 6, wherein the laser light providing module includes a beam quantity adjuster, and the beam quantity adjuster is a spatial light modulator or a beam distribution element having at least two through openings;

wherein, when the beam quantity adjuster is the beam distribution element, the at least two through openings of the beam distribution element are completely covered by a laser beam generate by the laser light providing module;

wherein, when the beam quantity adjuster is the beam distribution element, the beam distribution element is configured for allowing a part of the laser beam to pass through the at least two through openings so as to correspondingly form at least two projection beams, and a shortest distance between the at least two through openings is equal to a shortest distance between the at least two projection beams;

wherein, when the beam quantity adjuster is the beam distribution element, a size and a shape of a light spot projected by the projection beam on an active region of the photodiode are respectively changed according to a size and a shape of the through opening of the beam distribution element;

wherein, when the beam quantity adjuster is the spatial light modulator, the spatial light modulator is configured for allowing the laser beam to pass through or for reflecting the laser beam, thereby converting the laser beam into the at least two projection beams, and the spatial light modulator is configured for adjusting the shortest distance between the two projection beams, a quantity of the projection beams, and the size and the shape of the light spot of the projection beam;

wherein, when different positions of the active region of the same photodiode are excited by the projection beam so as to respectively generate a plurality of different electrical signals, the electrical detection module is configured for electrically contacting the photodiode so as to obtain a plurality of different electrical signals of the photodiode, thereby calculating an average current value of the photodiode or determining a maximum current position of the active region of the photodiode.

8. A laser light providing module without using an optical fiber, comprising:

a laser chip package structure;

an optical lens configured to be disposed adjacent to the laser chip package structure; and a beam quantity adjuster configured to be disposed adjacent to the optical lens;

wherein the laser chip package structure is configured for generating a laser light source projected onto the optical lens, and the optical lens is configured for converting the laser light source into a laser beam projected onto the beam quantity adjuster, and the beam quantity adjuster is configured for splitting the laser beam into a plurality of projection beams so as to simultaneously and correspondingly excite a plurality of photodiodes.

9. The laser light providing module according to claim 8, wherein the laser light providing module includes a module carrier configured for carrying the laser chip package structure, the optical lens and the beam quantity adjuster, and the laser chip package structure, the optical lens and the beam quantity adjuster are integrated into a single optical component by the module carrier;

wherein the laser chip package structure includes a package casing, two conductive pins partially exposed from the package casing, and a laser light-emitting diode chip disposed inside the package casing;

wherein the beam quantity adjuster is a spatial light modulator or a beam distribution element having at least two through openings;

wherein, when the beam quantity adjuster is the beam distribution element, the optical lens is configured for parallelly guiding the laser beam to project onto the at least two through openings, so that the at least two through openings are completely covered by the laser beam;

wherein, when the beam quantity adjuster is the beam distribution element, the beam distribution element is configured for allowing a part of the laser beam to pass through the at least two through openings so as to correspondingly form at least two projection beams, and a shortest distance between the at least two through openings is equal to a shortest distance between the at least two projection beams;

wherein, when the beam quantity adjuster is the beam distribution element, a size and a shape of a light spot projected by the projection beam on an active region of the photodiode are respectively changed according to a size and a shape of the through opening of the beam distribution element;

wherein, when the beam quantity adjuster is the spatial light modulator, the spatial light modulator is configured for allowing the laser beam to pass through or for reflecting the laser beam, thereby converting the laser beam into the at least two projection beams, and the spatial light modulator is configured for adjusting the shortest distance between the two projection beams, a quantity of the projection beams, and the size and the shape of the light spot of the projection beam.

10. The laser light providing module according to claim 8, wherein, when the beam quantity adjuster is a spatial light modulator, the spatial light modulator is configured for allowing the laser beam to pass through or for reflecting the laser beam, thereby converting the laser beam into the at least two projection beams, and the spatial light modulator is configured for adjusting a position of a light spot of the projection beam;

wherein, when different positions of an active region of the same photodiode are excited by the projection beam so as to respectively generate a plurality of different electrical signals, the electrical detection module is configured for electrically contacting the photodiode so as to obtain a plurality of different electrical signals of the photodiode, thereby calculating an average current value of the photodiode or determining a maximum current position of the active region of the photodiode.

* * * * *